United States Patent
Sakai et al.

(10) Patent No.: US 8,535,855 B2
(45) Date of Patent: Sep. 17, 2013

(54) MASK BLANK MANUFACTURING METHOD, TRANSFER MASK MANUFACTURING METHOD, MASK BLANK, AND TRANSFER MASK

(75) Inventors: Kazuya Sakai, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 194 days.

(21) Appl. No.: 13/109,132

(22) Filed: May 17, 2011

(65) Prior Publication Data

US 2011/0287346 A1 Nov. 24, 2011

(30) Foreign Application Priority Data

May 19, 2010 (JP) ................................. 2010-115834

(51) Int. Cl.
*G03F 1/68* (2012.01)
*B08B 7/02* (2006.01)

(52) U.S. Cl.
USPC ............................................ 430/5; 134/30

(58) Field of Classification Search
USPC ..................... 430/5; 134/1, 1.3, 30
See application file for complete search history.

(56) References Cited

U.S. PATENT DOCUMENTS

2004/0045579 A1* 3/2004 Miki et al. ...................... 134/1.3
2010/0261099 A1* 10/2010 Yoshikawa et al. ............... 430/5

FOREIGN PATENT DOCUMENTS

JP 2002-156742 A 5/2002
JP 2002-258455 A 9/2002

* cited by examiner

*Primary Examiner* — Stephen Rosasco
(74) *Attorney, Agent, or Firm* — Sughrue Mion, PLLC (57) ABSTRACT

Provided is a method of manufacturing a mask blank having a thin film on a transparent substrate. The method includes forming the thin film made of a material containing a transition metal on the transparent substrate and applying a superheated steam treatment to the thin film.

21 Claims, 6 Drawing Sheets

Etching Time 10.5 (min) Mo3d Overlay (ordinate axis: normalized)

Etching Time 10.5 (min) N1s Overlay (ordinate axis: normalized)

FIG. 6

Etching Time 10.5 (min) Si2p Overlay (ordinate axis: normalized)

MASK BLANK MANUFACTURING METHOD, TRANSFER MASK MANUFACTURING METHOD, MASK BLANK, AND TRANSFER MASK

This application is based upon and claims the benefit of priority from Japanese patent application No. 2010-115834, filed on May 19, 2010, the disclosure of which is incorporated herein in its entirety by reference.

TECHNICAL FIELD

This invention relates to methods of manufacturing a mask blank and a transfer mask improved in irradiation durablity and to such a mask blank and such a transfer mask. In particular, this invention relates to a method of manufacturing a mask blank for use in manufacturing a transfer mask to be suitably used in an exposure apparatus using exposure light having a short wavelength of 200 nm or less and to a method of manufacturing such a transfer mask and further relates to such a mask blank and such a transfer mask.

BACKGROUND ART

Generally, fine pattern formation is carried out by photolithography in the manufacture of a semiconductor device. A number of substrates called transfer masks are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by photolithography, use is made of a mask blank having a thin film (e.g. a thin film made of a material containing a transition metal) for forming a transfer pattern (mask pattern) on a transparent substrate such as a glass substrate. The manufacture of the transfer mask using the mask blank comprises an exposure process of writing a required pattern on a resist film formed on the mask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of exposure light for use in photolithography in addition to miniaturization of the mask pattern of the transfer mask. In recent years, the wavelength of exposure light for use in the manufacture of a semiconductor device has been shortened from KrF excimer laser light (wavelength: 248 nm) to ArF excimer laser light (wavelength: 193 nm).

As a type of transfer mask, a halftone phase shift mask is known apart from a conventional binary mask having a light-shielding film pattern made of a chromium-based material on a transparent substrate. This halftone phase shift mask is configured to have a phase shift film in the form of a light-semitransmissive film on a transparent substrate. This phase shift film in the form of the light-semitransmissive film has a function of transmitting light having an intensity that does not substantially contribute to exposure (e.g. 1% to 20% at an exposure wavelength) and a predetermined phase difference adjusting function (phase shift function). The halftone phase shift mask has phase shift portions formed by patterning the phase shift film and light-transmissive portions formed with no phase shift film and adapted to transmit light having an intensity that substantially contributes to exposure. The phase shift film is formed so that the phase of the light transmitted through the phase shift portions is substantially inverted with respect to that of the light transmitted through the light-transmissive portions. As a consequence, the lights having passed near the boundaries between the phase shift portions and the light-transmissive portions and bent into the others' regions due to diffraction cancel each other out. This makes the light intensity at the boundaries approximately zero to thereby improve the contrast, i.e. the resolution, at the boundaries. As a material of the phase shift film, a molybdenum silicide compound, which is a material containing molybdenum and silicon, is widely used.

Further, there is a special type of light-semitransmissive film which is mainly used as a thin film for forming a pattern of an enhancer mask. Light-semitransmissive portions formed by this light-semitransmissive film transmit exposure light at a predetermined transmittance, but different from the halftone phase shift film, the phase of the exposure light transmitted through the light-semitransmissive portions becomes approximately the same as the phase of the exposure light transmitted through light-transmissive portions. Also as a material of this light-semitransmissive film, a molybdenum silicide compound, which is a material containing molybdenum and silicon, is widely used.

Further, in recent years, there has also appeared a binary mask using, as a light-shielding film, a molybdenum silicide compound which is a material containing molybdenum and silicon.

SUMMARY OF THE INVENTION

Following the reduction in exposure light wavelength in recent years, however, mask degradation due to the repeated use of a transfer mask has become notable. Particularly in the case of a phase shift mask, a phenomenon occurs in which the transmittance and the phase difference change and further the line width of the pattern changes (increases) due to the irradiation of ArF excimer laser light (wavelength: 193 nm) as exposure light. In the case of the phase shift mask, such changes in the transmittance and phase difference are serious problems that affect the mask performance. If the change in the transmittance becomes large, the transfer accuracy is degraded. Along with this, if the change in the phase difference becomes large, the phase shift effect at the pattern boundaries is difficult to obtain so that the contrast at the pattern boundaries is lowered and thus the resolution is significantly reduced. Further, the change in the line width degrades the CD (Critical Dimension) accuracy of the phase shift mask and finally degrades the CD accuracy of a pattern-transferred wafer.

The problem of the mask degradation due to the repeated use of the transfer mask is significant particularly in the case of a phase shift mask in which a transition metal silicide compound, a material containing a transition metal and silicon, is used as a material of a phase shift film. But, also in the case of an enhancer mask in which a transition metal silicide compound, a material containing a transition metal and silicon, is used as a material of a light-semitransmissive film, there have arisen problems of a change in the transmittance of the light-semitransmissive film, a change in the phase difference, and a degradation in the CD accuracy due to a change (increase) in the line width of the pattern.

Also in the case of a binary mask in which a material containing a transition metal and silicon is used as a material of a light-shielding film or a binary mask in which a material containing a transition metal is used as a material of a light-shielding film, the degradation in the CD accuracy due to a change (increase) in line width of a light-shielding film pattern arises as a problem in the same way.

According to the study of the present inventors, the background of the problem of the mask degradation due to the repeated use of the transfer mask is assumed as follows. Conventionally, for example, when haze (e.g. foreign matter composed mainly of ammonium sulfide and generated on the mask) is generated, cleaning is carried out for removing the haze. This cleaning entails an unavoidable film loss (dissolution) of a light-shielding film or a light-semitransmissive film and thus, roughly, the number of times of cleaning determines the mask lifetime. However, since the number of times of cleaning is reduced due to an improvement to haze in recent years, the period of time of the repeated use of a mask is prolonged and thus the time of exposure to exposure light is prolonged correspondingly. As a consequence, the problem of the mask degradation has been actualized and, particularly, a problem of irradiation durablity to short-wavelength light such as ArF excimer laser light has been newly actualized. Nevertheless, since the transfer mask manufacturing cost has been increasing following the pattern miniaturization, there is an increasing need for a longer lifetime of a transfer mask.

Also conventionally, a measure has been taken to suppress the change in the transmittance of the phase shift film and the change in the phase difference due to the irradiation of exposure light. For example, a phase shift film composed mainly of a metal and silicon is heat-treated in the atmosphere or an oxygen atmosphere at 250 to 350° C. for 90 to 150 minutes (see, e.g. JP-A-2002-156742 (Patent Document 1)) or a cap layer composed mainly of a metal and silicon is formed on a phase shift film composed mainly of a metal and silicon (see, e.g. JP-A-2002-258455 (Patent Document 2)). However, a further improvement in irradiation durablity of a film to exposure light is required in the course of the reduction in wavelength of exposure light in recent years.

This invention has been made under these circumstances and has an object to provide a mask blank that is improved in irradiation durablity of a thin film, made of a material containing a transition metal, to exposure light having a wavelength of 200 nm or less and thus can significantly improve the mask lifetime, and further to provide a method of manufacturing such a mask blank, a transfer mask manufactured from such a mask blank, and a method of manufacturing such a transfer mask.

The present inventors have assumed a cause of the degradation of the transfer mask due to its repeated use becoming notable following the reduction in exposure light wavelength, as follows.

The present inventors have examined a pattern of a phase shift film made of a MoSi-based material and subjected to changes in the transmittance and phase difference and a change (increase) in the line width due to the repeated use. As a result, the present inventors have found that a modified layer containing Si, O, and a little Mo is formed on the surface layer side of the MoSi-based film and that this is one of main causes of the changes in the transmittance, the phase difference, and the line width. The reason (mechanism) for the formation of such a modified layer is considered as follows. That is, the conventional sputtered MoSi-based film (phase shift film) has structural gaps and, even if annealing is carried out after the film formation, the change in the structure of the MoSi-based film is small and thus these gaps can hardly be removed. On the other hand, for example, oxygen ($O_2$) and water ($H_2O$) are present in the atmosphere and ozone ($O_3$) is produced by reaction of oxygen ($O_2$) with ArF excimer laser light in the course of using a phase shift mask. The oxygen and the produced ozone enter the gaps of the MoSi-based film and react with Si and Mo forming the phase shift film. That is, when Si and Mo forming the phase shift film are subjected to irradiation of exposure light (particularly short-wavelength light such as ArF excimer laser light), they are excited into a transition state. In this event, if the ozone or the like is present around them, Si is oxidized and expanded (because $SiO_2$ is larger in volume than Si) and Mo is also oxidized. In this manner, the modified layer is formed on the surface layer side of the phase shift film. Then, while being accumulatively subjected to the irradiation of the exposure light due to the repeated use of the phase shift mask, the oxidation and expansion of Si further proceed and the oxidized Mo diffuses in the modified layer to be separated onto a surface thereof and sublimated as, for example, $MoO_3$, and as a result, the thickness of the modified layer gradually increases (the occupation ratio of the modified layer in the MoSi-based film gradually increases). This phenomenon of the formation and enlargement of the modified layer is significantly observed in the case of short-wavelength (200 nm or less) exposure light such as ArF excimer laser light having energy necessary for exciting Si and Mo of the phase shift film into the transition state. Such a phenomenon is not limited to the MoSi-based material, but also occurs in the case of a phase shift film made of a material containing another transition metal and silicon. Further, this also applies to an enhancer mask having a light-semitransmissive film made of a material containing a transition metal and silicon, a binary mask having a light-shielding film made of a material containing a transition metal and silicon, and a binary mask having a light-shielding film made of a material containing a transition metal.

Based on the elucidated fact and consideration described above, the present inventors have further continued intensive studies. As a result, the present inventors have found that, by carrying out a superheated steam treatment, a thin film made of a material containing a transition metal is heated in its entirety due to a combined heat transfer action to cause a change in the structure of the thin film itself such as in the bound state thereof, that this structural change significantly suppresses a change such as an increase in volume of the thin film even if exposure light such as ArF excimer laser light is irradiated, and that, as a result, it is possible to significantly improve the irradiation durablity and thus to significantly improve the mask lifetime, and has completed this invention.

This invention has the following structures.

(Structure 1)

A method of manufacturing a mask blank having a thin film on a transparent substrate, comprising the steps of:

forming the thin film made of a material containing a transition metal on the transparent substrate; and applying a superheated steam treatment to the thin film.

(Structure 2)

The method according to Structure 1, wherein the material further contains silicon.

(Structure 3)

The method according to Structure 1 or 2, wherein a temperature of the superheated steam treatment is 500° C. or more.

(Structure 4)
The method according to any one of Structures 1 to 3, wherein the thin film is a light-semitransmissive film and the material further contains one or more elements selected from oxygen and nitrogen.

(Structure 5)
The method according to any one of Structures 1 to 3, wherein the thin film is a light-shielding film.

(Structure 6)
A method of manufacturing a transfer mask having, on a transparent substrate, a pattern of a thin film made of a material containing a transition metal, comprising the steps of:
forming the pattern of the thin film by patterning the thin film formed on the transparent substrate; and
applying a superheated steam treatment to the pattern of the thin film.

(Structure 7)
The method according to Structure 6, wherein the material further contains silicon.

(Structure 8)
The method according to Structure 6 or 7, wherein a temperature of the superheated steam treatment is 500° C. or more.

(Structure 9)
The method according to any one of Structures 6 to 8, wherein the thin film is a light-semitransmissive film and the material further contains one or more elements selected from oxygen and nitrogen.

(Structure 10)
The method according to any one of Structures 6 to 8, wherein the thin film is a light-shielding film.

(Structure 11)
A mask blank having a thin film on a transparent substrate, wherein the thin film is made of a material containing a transition metal and is modified by applying a superheated steam treatment thereto.

(Structure 12)
The mask blank according to Structure 11, wherein the material further contains silicon.

(Structure 13)
The mask blank according to Structure 11 or 12, wherein a temperature of the superheated steam treatment is 500° C. or more.

(Structure 14)
The mask blank according to any one of Structures 11 to 13, wherein the thin film is a light-semitransmissive film and the material further contains one or more elements selected from oxygen and nitrogen.

(Structure 15)
The mask blank according to any one of Structures 11 to 13, wherein the thin film is a light-shielding film.

(Structure 16)
A transfer mask manufactured by using the mask blank according to any one of Structures 11 to 15 and patterning the thin film.

(Structure 17)
A transfer mask having a pattern of a thin film on a transparent substrate,
wherein the pattern of the thin film is a film that is made of a material containing a transition metal and is modified by applying a superheated steam treatment thereto.

(Structure 18)
The transfer mask according to Structure 17, wherein the material further contains silicon.

(Structure 19)
The transfer mask according to Structure 17 or 18, wherein a temperature of the superheated steam treatment is 500° C. or more.

(Structure 20)
The transfer mask according to any one of Structures 17 to 19, wherein the thin film is a light-semitransmissive film and the material further contains one or more elements selected from oxygen and nitrogen.

(Structure 21)
The transfer mask according to any one of Structures 17 to 19, wherein the thin film is a light-shielding film.

(Structure 22)
A mask blank having a thin film on a transparent substrate,
wherein the thin film is made of a material composed mainly of molybdenum, silicon, and nitrogen, and
the thin film has peaks around 250 $cm^{-1}$ and around 500 $cm^{-1}$ when normalized around 1000 $cm^{-1}$ in Raman spectroscopic analysis of the thin film.

(Structure 23)
A method of manufacturing a semiconductor device, comprising forming a circuit pattern on a semiconductor wafer using a transfer mask which is manufactured using the mask blank according to Structure 11 or 22.

(Structure 24)
A method of manufacturing a semiconductor device, comprising forming a circuit pattern on a semiconductor wafer using the transfer mask according to Structure 17.

Hereinbelow, this invention will be described in detail.

A method of manufacturing a mask blank according to this invention is a method of manufacturing a mask blank having a thin film on a transparent substrate, and comprises the steps of:
forming the thin film made of a material containing a transition metal on the transparent substrate; and
applying a superheated steam treatment to the thin film.

In this invention, "superheated steam" represents water in a completely gaseous state obtained by further heating saturated steam to a temperature above its boiling point.

The superheated steam has a greater heat capacity than heated air and thus can rapidly heat a workpiece to shorten the heating time. Heat transfer by air is limited to convection heat transfer, while, in the case of the superheated steam, convection heat transfer is 10 or more times that by air and, in addition thereto, the combined heat transfer action including radiant heat transfer and condensation heat transfer occurs, and therefore, the thermal efficiency is high.

The condensation heat transfer is such that the superheated steam condenses immediately upon contact with the workpiece so that condensed water adheres to the workpiece and a large amount of heat due to condensation heat is transferred. Thereafter, the water starts to evaporate and the workpiece starts to dry.

According to this invention, by applying the superheated steam treatment to the thin film, the thin film is heated in its entirety due to the combined heat transfer action so that the structure of the thin film itself such as the bound state thereof changes. As a consequence, it is possible to significantly suppress a change such as an increase in volume of the thin film even if exposure light such as ArF excimer laser light is irradiated.

In the DRAM half-pitch (hp) 32 nm generation according to the semiconductor device design rule, it is necessary to set CD variation to 2.6 nm or less on a wafer. Therefore, CD variation required for a transfer mask for use in the hp 32 nm generation is preferably suppressed to 5 nm or less. According to this invention, when a transfer mask is manufactured, CD variation of a thin film pattern can be set to 5 nm or less.

Further, since the superheated steam treatment is excellent in thermal efficiency, the treatment can be carried out in a short time and thus it is possible to reduce the heat load to the substrate body. As a consequence, only the thin film can be efficiently heated without raising the substrate temperature.

In the superheated steam treatment, only the thin film can be heated more efficiently and, in this event, the rise in temperature of the substrate body can be suppressed due to the short-time treatment. In contrast, in a conventional heating method using air as a medium in an electric furnace, a thin film is heated through a substrate. In this way, the superheated steam treatment and the conventional heating method largely differ from each other.

Further, since the superheated steam treatment is excellent in thermal efficiency, the high-temperature treatment can be carried out in a short time. Therefore, for example, the change (modification) in the structure of the thin film itself such as in the bound state thereof is facilitated. Further, the throughput can be enhanced. In this way, since the heat capacity is large in the superheated steam treatment, it is one of the features that the thin film (bulk) can be more efficiently modified by the short-time process. It is also one of the features that the temperature of the thin film can be raised to a desired high temperature in a short time.

Further, in the superheated steam treatment, the thin film itself (bulk itself) can be strengthened (not only the surface but also the entire bulk in its depth direction can be modified). As a consequence, if the superheated steam treatment is applied to the thin film in a mask blank, it is not necessary to carry out a treatment for improving the irradiation durablity of a pattern side wall after producing a transfer mask.

Further, in the superheated steam treatment, since the thin film itself (bulk itself) can be strengthened, it is possible to improve even the chemical durability (alkali durability, hot water durability). As a consequence, the chemical durability is excellent even after a transfer mask is produced.

In this invention, as the transition metal, use can be made of molybdenum, tantalum, tungsten, titanium, chromium, hafnium, nickel, vanadium, zirconium, ruthenium, rhodium, or the like.

In this invention, the thin film may be made of a material containing, in addition to the transition metal, one or more elements selected from nitrogen, oxygen, carbon, hydrogen, inert gases (helium, argon, xenon, etc.), and so on.

In this invention, the thin film can be a light-shielding film in a binary mask or a light-semitransmissive film in a phase shift mask.

In this invention, the thin film may be made of a material containing the transition metal and silicon (Structure 2).

By carrying out the superheated steam treatment, the thin film made of the material containing the transition metal and silicon is heated in its entirety due to the combined heat transfer action so that the structure of the thin film itself such as the bound state thereof changes. As a consequence, it is possible to significantly suppress a change such as an increase in line width even if exposure light such as ArF excimer laser light is irradiated.

As described above, when the thin film is made of the material containing the transition metal and silicon and the superheated steam treatment is not carried out, the phenomenon remarkably occurs in which the line width changes (increases) due to the irradiation of ArF excimer laser light (wavelength: 193 nm). Therefore, the effect of improvement by the superheated steam treatment is also remarkable.

In this invention, the thin film may be made of a material containing, in addition to the transition metal and silicon, one or more elements selected from nitrogen, oxygen, carbon, hydrogen, inert gases (helium, argon, xenon, etc.), and so on.

In this invention, the thin film can be a light-shielding film in a binary mask or a light-semitransmissive film in a phase shift mask.

In this invention, the temperature of the superheated steam treatment is preferably 500° C. or more (Structure 3).

The temperature of the superheated steam treatment is preferably 550° C. or more and more preferably 650° C. or more. On the other hand, the temperature of the superheated steam treatment is preferably 950° C. or less and more preferably 800° C. or less. This is because if it is too high, changes in the stress and optical properties of the thin film become large.

The temperature of the superheated steam treatment is preferably set to a temperature that causes the temperature of the thin film to be 650° C. or more.

The treatment time of the superheated steam treatment differs depending on the temperature conditions and so on, but is preferably not more than 10 minutes during which the substrate temperature does not rise, and more preferably 5 minutes or less.

An atmosphere in which the superheated steam treatment is carried out is not particularly limited. The superheated steam treatment can be carried out in air, in oxygen, in nitrogen, in an atmosphere containing oxygen and nitrogen, or the like.

In this invention, as a means or an apparatus for generating the superheated steam, use can be made of, for example, a known means or apparatus that is adapted to raise the temperature of steam to obtain superheated steam.

Figure 9:
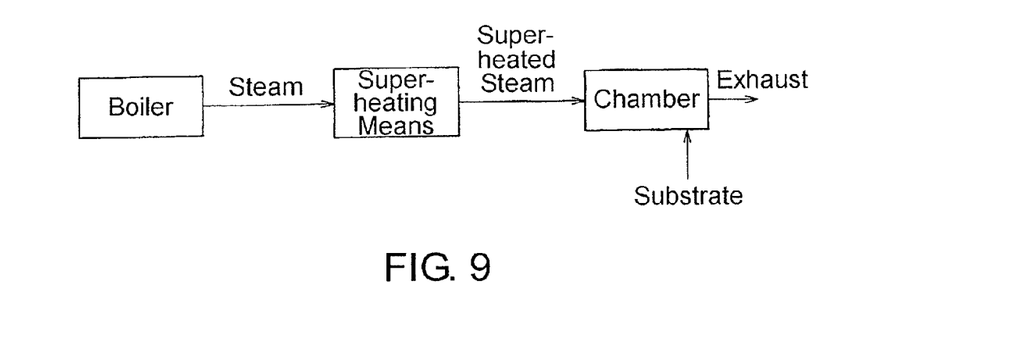
FIG. 9 is an exemplary diagram for explaining one example of a superheated steam treatment.

As an apparatus for carrying out the superheated steam treatment, an apparatus shown in FIG. 9, for example, is exemplified. In the apparatus shown in FIG. 9, steam (e.g. 100° C.) generated in a boiler is heated by a superheating means as a means for obtaining superheated steam to thereby generate superheated steam (e.g. 500 to 950° C.) and then the superheated steam is supplied to a thin film on a substrate disposed at a predetermined position in a chamber to thereby bring the thin film and the superheated steam into contact with each other.

As the superheating means, use can be made of a method which provides thermal energy from the outside, such as a method using induction heating (high-frequency induction heating, electromagnetic induction heating) or a method using lamp heating. In the method using high-frequency induction heating, for example, superheated steam is obtained by Joule heat which is generated when a high-frequency current (AC) flows through a coil.

The chamber is preferably formed of a metal-free material (e.g. quartz). The chamber is preferably at the atmospheric pressure (open system) and is preferably provided with an exhaust means. The superheated steam generated by the superheating means can be injected from a nozzle and supplied into the chamber.

The amount of the superheated steam can be adjusted according to the processing capabilities of the boiler and the superheating means and so on. In this invention, the amount of the superheated steam is preferably set so that the effect of this invention can be sufficiently obtained.

In this invention, the thin film may be a light-semitransmissive film made of a material containing the transition metal, silicon, and one or more elements selected from oxygen and nitrogen (Structure 4).

This is because, as described above, when the thin film is the light-semitransmissive film (e.g. phase shift film) made of the material containing the transition metal, silicon, and one or more elements selected from oxygen and nitrogen and the superheated steam treatment is not carried out, the phenomenon remarkably occurs in which the transmittance and the phase difference change and further the line width changes (increases) due to the irradiation of ArF excimer laser light (wavelength: 193 nm).

Herein, as the transition metal, use can be made of molybdenum, tantalum, tungsten, titanium, chromium, hafnium, nickel, vanadium, zirconium, ruthenium, rhodium, or the like.

In this invention, the light-semitransmissive film (e.g. phase shift film) may be made of a material containing, in addition to the transition metal and silicon, one or more elements selected from nitrogen, oxygen, carbon, hydrogen, inert gases (helium, argon, xenon, etc.), and so on.

The light-semitransmissive film (e.g. phase shift film) may comprise, for example, a transition metal silicide, a transition metal silicide nitride, a transition metal silicide oxynitride, or a transition metal silicide oxide.

In this invention, the phase shift film may have a single-layer structure, a two-layer structure comprising a low-transmittance layer and a high-transmittance layer, or a multilayer structure.

The phase shift film may be of the high-transmittance type. The high-transmittance type has a relatively high transmittance of 10% to 30% while the transmittance is normally 1% to less than 10%.

In this invention, when the phase shift film is made of a material containing molybdenum, silicon, and nitrogen, the contents of the elements in the film are preferably such that, for example, the (Mo/Mo+Si) ratio is 2% to 20% and the content of nitrogen is 30at % to 70at %.

In this invention, the thin film may be a light-shielding film (Structure 5).

This is because, as described above, the problem of irradiation durablity also applies to the light-shielding film.

The light-shielding film may have a single-layer structure or a plural-layer structure or may be a composition gradient film.

The light-shielding film may comprise an antireflection layer.

The light-shielding film may have a three-layer structure comprising a back-surface antireflection layer, a light-shielding layer, and a front-surface antireflection layer.

The light-shielding film may have a two-layer structure comprising a light-shielding layer and a front-surface antireflection layer.

In this invention, the light-shielding film may be made of a material containing, in addition to the transition metal and silicon, one or more elements selected from nitrogen, oxygen, carbon, hydrogen, inert gases (helium, argon, xenon, etc.), and so on. The light-shielding film may comprise, for example, a transition metal silicide, a transition metal silicide nitride, a transition metal silicide oxynitride, or a transition metal silicide oxide.

In this invention, the light-shielding film may be made of a material containing, in addition to the transition metal, one or more elements selected from nitrogen, oxygen, carbon, hydrogen, inert gases (helium, argon, xenon, etc.), and so on.

In this invention, when the light-shielding film is made of molybdenum silicide compounds, the light-shielding film may have, for example, a two-layer structure comprising a light-shielding layer (MoSi or the like) and a front-surface antireflection layer (MoSiON or the like) or a three-layer structure further comprising a back-surface antireflection layer (MoSiON, MoSiN, or the like) between the light-shielding layer and the substrate.

When the light-shielding film is made of a molybdenum silicide compound, the contents of the elements in the film are preferably such that, for example, the (Mo/Mo+Si) ratio is 7% to 40% and the total content of nitrogen and oxygen is 40 at % or less.

In this invention, since the structures of the mask blanks according to the Structures 11 to 15 are basically the same as the structures which have been described in the mask blank manufacturing methods according to the Structures 1 to 5, a description thereof will be omitted.

In this invention, the mask blanks according to the Structures 11 to 15 can be manufactured by the mask blank manufacturing methods according to the Structures 1 to 5.

In this invention, the transfer mask manufacturing methods according to the Structures 6 to 10 and the transfer masks according to the Structures 17 to 21 are such that the superheated steam treatment is carried out after patterning the thin film (e.g. after manufacturing the mask).

The difference is whether the superheated steam treatment is carried out for the pattern of the thin film formed on the transfer mask (Structures 6 to 10 and 17 to 21) or the superheated steam treatment is carried out for the thin film formed on the mask blank (Structures 1 to 5 and 11 to 15).

In this invention, since the structures of the transfer mask manufacturing methods according to the Structures 6 to 10 and the structures of the transfer masks according to the Structures 17 to 21 are basically the same as the structures which have been described in the mask blank manufacturing methods according to the Structures 1 to 5, a description thereof will be omitted.

A mask blank according to this invention is a mask blank which has a thin film on a transparent substrate. The thin film is made of a material composed mainly of molybdenum, silicon, and nitrogen. The thin film has peaks around 250 $cm^{-1}$ and around 500 $cm^{-1}$ when normalized around 1000 $cm^{-1}$ in Raman spectroscopic analysis of the thin film (Structure 22).

As seen from the Raman spectroscopic analysis results (FIG. 3) which will be shown in later-described Examples, the thin film made of the material composed mainly of molybdenum, silicon, and nitrogen can be said to be amorphous because the peak is broad. The half width (FWHM) of a Raman band around 1000 $cm^{-1}$ resulting from Si—N bonds is slightly smaller due to the superheated steam treatment and it is considered that the order of the amorphous SiN structure is enhanced.

Further, Raman bands around 250 $cm^{-1}$ and around 500 $cm^{-1}$ are relatively large and it is considered that amorphous molybdenum nitride and/or molybdenum silicide, and so on are formed.

In this invention, for example, the mask blank according to the Structure 22 can be manufactured by the mask blank manufacturing methods according to the Structures 1 to 5.

In the Raman spectroscopic analysis results of the thin film made of the material composed mainly of molybdenum, silicon, and nitrogen and subjected to the superheated steam treatment, two portions where Raman bands resulting from the structure of molybdenum (e.g. MoSi, MoSiN, etc.) are relatively large appear in a region on the left side of a Raman band around 1000 $cm^{-1}$ resulting from Si—N bonds (a region on the low wavenumber side), for example, in a region of 150 $cm^{-1}$ to 700 $cm^{-1}$ or in a region of 200 $cm^{-1}$ to 600 $cm^{-1}$. This is considered to be because stable substances (e.g. amorphous molybdenum nitride and/or molybdenum silicide) are formed in a relatively large amount as compared with the case where the superheated steam treatment is not carried out. Alternatively, this is considered to be because, as compared with the case where the superheated steam treatment is not carried out, new structures (e.g. structures containing molybdenum, i.e. Mo—Si bonds, Mo—Si—N bonds, etc.) are formed in a relatively large amount so that the structure of molybdenum is more stabilized. Alternatively, this is considered to be because a change occurs in the crystal structure containing molybdenum so that the structure of molybdenum is more stabilized. As a consequence, it is considered that the irradiation durablity and so on can be significantly improved.

In this invention, the thin film made of the material composed mainly of molybdenum, silicon, and nitrogen has two portions where Raman bands resulting from a change in the structure of the thin film itself such as in the bound state thereof (e.g. the above-mentioned structure of molybdenum, the above-mentioned new structures, or the above-mentioned change in the crystal structure) are relatively large, in a region on the left side of a Raman band around 1000 $cm^{-1}$ resulting from Si—N bonds (a region on the low wavenumber side), for example, in a region of 150 $cm^{-1}$ to 700 $cm^{-1}$ or in a region of 200 $cm^{-1}$ to 600 $cm^{-1}$.

In this invention, the thin film made of the material composed mainly of molybdenum, silicon, and nitrogen has two portions where Raman bands resulting from the superheated steam treatment are relatively large, in a region on the left side of a Raman band around 1000 $cm^{-1}$ resulting from Si—N bonds (a region on the low wavenumber side), for example, in a region of 150 $cm^{-1}$ to 700 $cm^{-1}$ or in a region of 200 $cm^{-1}$ to 600 $cm^{-1}$. The Raman band resulting from the superheated steam treatment is a Raman band which is recognized when reaching a state where the appearance of a Raman band judged to result from the superheated steam treatment is recognized and its relevance to improvement in the irradiation durablity is also recognized, from a state where when the superheated steam treatment is not carried out, a Raman band is not recognized or only a Raman band having a peak with a small absolute value is recognized so that its relevance to improvement in the irradiation durablity is not recognized.

In this invention, the transparent substrate is not particularly limited as long as it has transparency at an exposure wavelength to be used. In this invention, a quartz substrate and various other glass substrates (e.g. $CaF_2$ substrate, soda-lime glass substrate, alkali-free glass substrate, aluminosilicate glass substrate, etc.) can be used. Among them, the quartz substrate is particularly suitable for this invention because it has high transparency in the wavelength range of ArF excimer laser light.

In this invention, sputtering is preferably used as a method of forming the thin film on the transparent substrate, but this invention is not limited thereto.

A DC magnetron sputtering apparatus is preferably used as a sputtering apparatus, but this invention is not limited to this film forming apparatus. Another type of sputtering apparatus such as a RF magnetron sputtering apparatus may alternatively be used.

In this invention, the transfer mask may be a binary mask that does not use the phase shift effect, or a phase shift mask. The transfer mask may be a reticle.

The phase shift mask may be a phase shift mask of the halftone type (tri-tone type), the Levenson type, the auxiliary pattern type, the self-aligned type (edge-enhanced type), or the like or an enhancer mask.

In this invention, the mask blank may be a resist-coated mask blank.

In this invention, the resist is preferably a chemically amplified resist. This is because it is suitable for high-accuracy processing.

In this invention, the resist is preferably a resist for electron beam writing. This is because it is suitable for high-accuracy processing.

This invention is applicable to an electron-beam-writing mask blank adapted to be formed with a resist pattern by electron beam writing.

In this invention, another thin film can be formed in addition to the light-semitransmissive film or the light-shielding film.

In this invention, a pattern of another thin film can be formed in addition to the pattern of the light-semitransmissive film or the pattern of the light-shielding film.

For example, in the case where the material of the light-semitransmissive film or the light-shielding film is a transition metal silicide, a material of the other thin film can be composed of a material having etching selectivity (etching resistance) to the light-semitransmissive film or the light-shielding film, such as chromium, a chromium compound in which an element such as oxygen, nitrogen, or carbon is added to chromium, another transition metal, another transition metal silicide, or the like.

On the other hand, for example, in the case where the material of the light-semitransmissive film or the light-shielding film is a transition metal (e.g. a material containing chromium), a material of the other thin film can be composed of a material having etching selectivity (etching resistance) to the light-semitransmissive film or the light-shielding film, such as a silicide of the transition metal, another transition metal, another transition metal silicide, or the like.

The other thin film may be a light-shielding film which is formed on the upper or lower side of the light-semitransmissive film (e.g. phase shift film), an etching mask film, an etching stopper film, or the like. As the other thin film, use is made of, for example, a material containing chromium.

In the case of providing an etching mask film on the light-shielding film, if the stress change of a material of the etching mask film due to heat is large like a Cr-based material, it is preferable to carry out the superheated steam treatment before forming the etching mask film for the purpose of avoiding the stress change.

Also in the case of providing a light-shielding film made of a Cr-based material on the light-semitransmissive film, it is preferable to carry out the superheated steam treatment before forming the light-shielding film.

In this invention, as the material containing chromium, use can be made of chromium (Cr) alone or a material containing chromium (Cr) and one or more elements selected from nitrogen (N), oxygen (O), carbon (C), hydrogen (H), helium (He), and so on. For example, use can be made of Cr, CrN, CrO, CrNO, CrNC, CrCON, or the like or a material containing, in addition thereto, hydrogen (H) or helium (He).

In this invention, use can be made of, for example, a fluorine-based gas such as $SF_6$, $CF_4$, $C_2F_6$, or $CHF_3$ or a mixed gas of such a fluorine-based gas and He, $H_2$, $N_2$, Ar, $C_2H_4$, $O_2$, or the like for dry-etching the thin film containing the transition metal and silicon.

In this invention, use can be made of a dry etching gas in the form of a mixed gas containing a chlorine-based gas and an oxygen gas for dry-etching the chromium-based thin film.

In this invention, as the chlorine-based gas for use in the dry etching, use can be made of, for example, $Cl_2$, $SiCl_4$, HCl, $CCl_4$, $CHCl_3$, or the like.

According to this invention, by carrying out the superheated steam treatment, the thin film made of the material containing the transition metal can be significantly improved in irradiation durablity to exposure light such as ArF excimer laser light and thus can significantly improve the mask lifetime.

DESCRIPTION OF THE EXEMPLARY EMBODIMENTS

Hereinbelow, this invention will be described in more detail with reference to Examples.

EXAMPLE 1

(Thin Film Forming Process)

Figure 1:
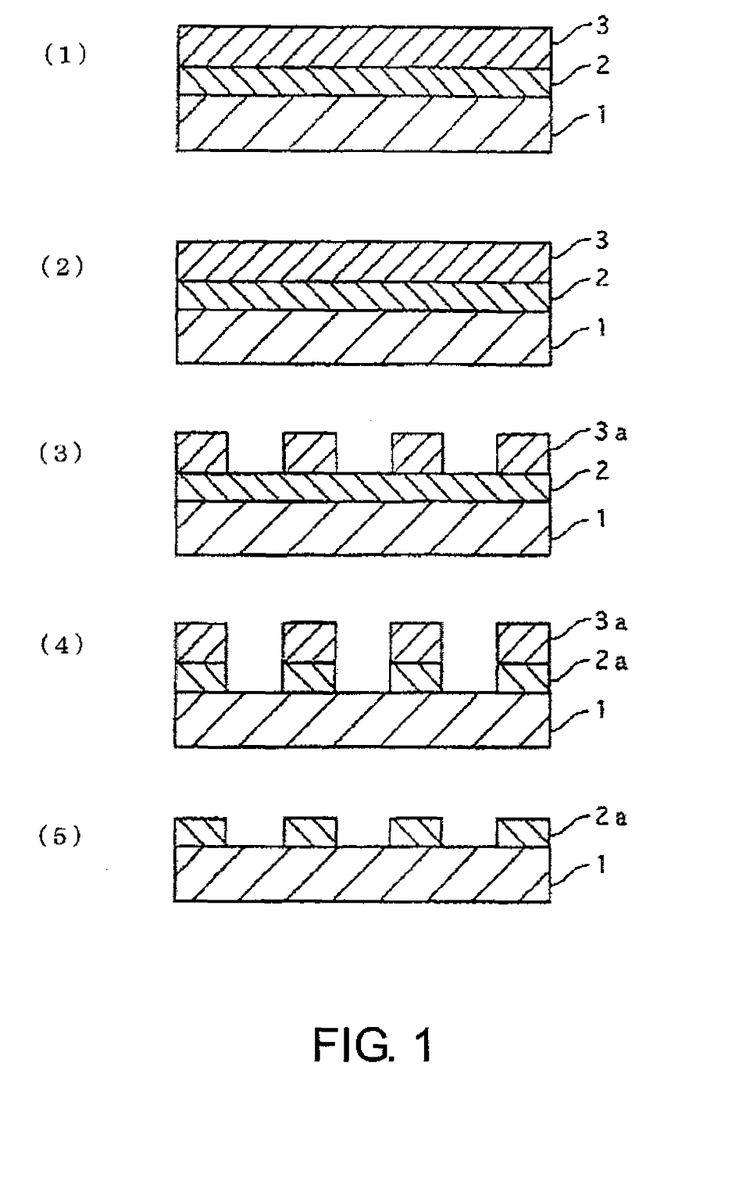
FIGS. 1, (1) to (5) are exemplary cross-sectional views showing the processes of manufacturing a phase shift mask.

As shown in FIG. 1, (1), using a synthetic quartz glass substrate having a 6-inch square size with a thickness of 0.25 inches as a transparent substrate 1, a light-semitransmissive film (phase shift film) 2 made of nitrided molybdenum and silicon was formed on the transparent substrate 1.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:$N_2$:He=5:49:46) at a gas pressure of 0.3 Pa, thereby forming a MoSiN film made of molybdenum, silicon, and nitrogen and having a thickness of 69 nm.

(Heat Treatment after Film Formation)

Then, a heat treatment was applied to the transparent substrate formed with the MoSiN film. Specifically, the heat treatment was carried out in the atmosphere at a heating temperature of 280° C. for a heating time of 10 minutes.

This MoSiN film had a transmittance of 6.1% with a phase difference of 179.2 degrees for ArF excimer laser light.

(Superheated Steam Treatment)

Then, a superheated steam treatment was applied to the heat-treated MoSiN film. Using the apparatus shown in FIG. 9, the conditions of the superheated steam treatment were such that the temperature was set to 750° C. (temperature at an outlet of the nozzle for supplying superheated steam into the chamber) and the treatment time was set to 10 minutes.

COMPARATIVE EXAMPLE 1

"Thin Film Forming Process" was carried out under the same conditions as in Example 1 and, in "Heat Treatment after Film Formation", a heat treatment was carried out at 280° C. for 10 minutes in an electric furnace, which were the same conditions as in Example 1. "Superheated Steam Treatment" was not carried out in Comparative Example 1.

(Evaluation)

(1) Analysis of Thin Film

The Raman spectroscopic analysis and the X-ray photoelectron spectroscopic (XPS) analysis were carried out for the superheated steam treated workpiece (sample of Example 1) and the superheated steam non-treated workpiece (sample of Comparative Example 1).

(I) Raman Spectroscopic analysis Results

Figure 3:
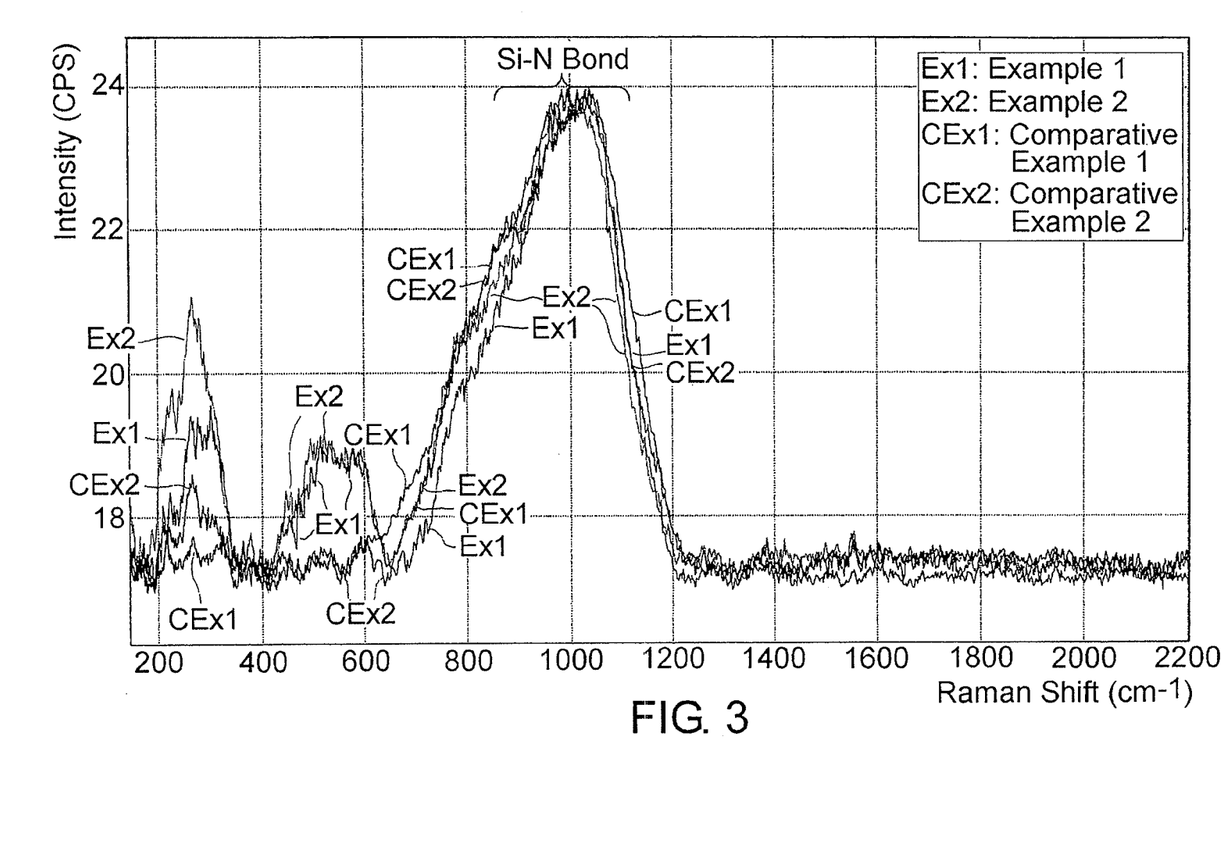
FIG. 3 is a diagram showing the results of the Raman spectroscopic analysis.

FIG. 3 shows the Raman spectroscopic analysis results of the superheated steam treated workpiece (sample of Example 1) and the superheated steam non-treated workpiece (sample of Comparative Example 1).

In FIG. 3, peaks due to the transparent substrate in measured data were removed (in order to remove the influence of the substrate, measurement was carried out also on the back side of the substrate to thereby obtain a difference spectrum) and, after baseline correction of each difference spectrum, the difference spectra were normalized around 1000 $cm^{-1}$, i.e. around the peak of a Raman band resulting from Si—N bonds.

As shown in FIG. 3, since the peak of each Raman band is broad, the structures of both samples can be said to be amorphous. In the case of the superheated steam treated workpiece (sample of Example 1), the half width (FWHM) of the Raman band around 1000 $cm^{-1}$ resulting from Si—N bonds is slightly smaller as compared with the superheated steam non-treated workpiece (sample of Comparative Example 1) and, therefore, it is considered that the order of the amorphous SiN structure is enhanced by the superheated steam treatment. Further, in the case of the superheated steam treated workpiece, Raman bands around 250 $cm^{-1}$ and around 500 $cm^{-1}$ are relatively large as compared with the superheated steam non-treated workpiece and, therefore, it is considered that amorphous molybdenum nitride and/or molybdenum silicide, and so on are formed.

(II) XPS analysis Results

Figure 4:
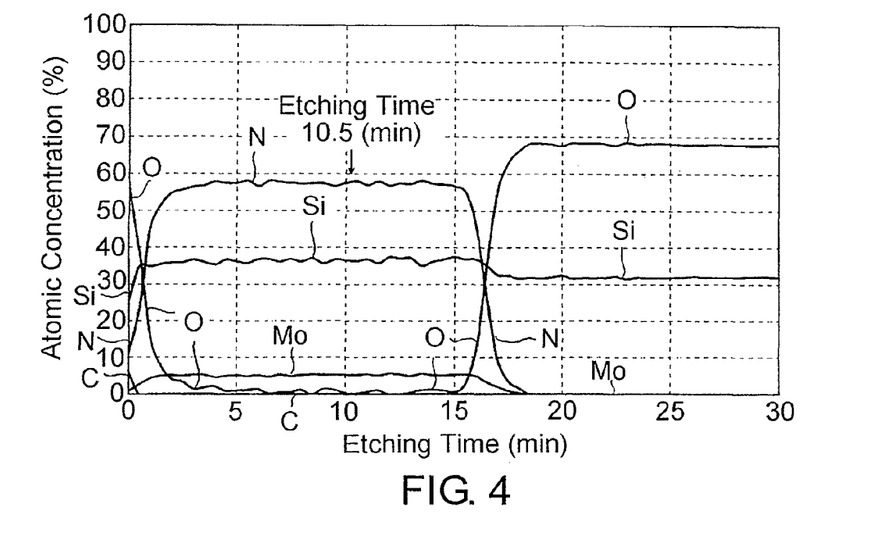
FIG. 4 is a diagram showing the XPS analysis results of a thin film subjected to a superheated steam treatment.
Figure 5:
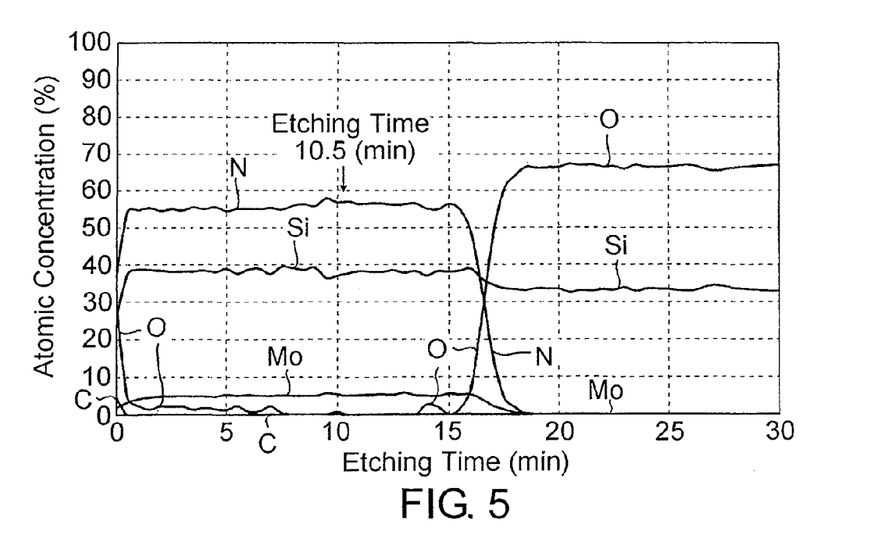
FIG. 5 is a diagram showing the XPS analysis results of a thin film not subjected to a superheated steam treatment.

FIG. 4 shows the XPS analysis results of the superheated steam treated workpiece (sample of Example 1). FIG. 5 shows the XPS analysis results of the superheated steam non-treated workpiece (sample of Comparative Example 1).

(i) Elemental Composition and Chemical State of Outermost Surface

Carbon, nitrogen, oxygen, and molybdenum were observed in both samples, i.e. the superheated steam treated workpiece (sample of Example 1) and the superheated steam non-treated workpiece (sample of Comparative Example 1). The tendency was that the N/Si ratio was higher in the superheated steam non-treated workpiece than in the superheated steam treated workpiece, while, the O/Si ratio was higher in the superheated steam treated workpiece than in the superheated steam non-treated workpiece.

With respect to the chemical state of silicon, it is considered that $SiN_x$ components (including $SiO_xN_y$ components) are predominant in the superheated steam non-treated workpiece, while, $SiO_2$ components (including $SiO_xN_y$ components) are predominant in the superheated steam treated workpiece. Accordingly, a surface oxide film (layer) formed by the superheated steam treatment has an effect of improving the chemical durability (hot water durability etc.) as compared with a surface oxide film (layer) formed by the heat treatment at 250 to 450° C. In the case where the superheated steam treatment is carried out after forming a transfer mask, since the above-mentioned surface oxide film (layer) is formed also in a pattern side wall, it is excellent in chemical durability (hot water durability etc.).

(ii) Composition Distribution and Chemical State in Depth Direction

In each sample, the layer structure was a single layer structure of MoSiN/QZ. There was observed a tendency that the oxygen concentration near the surface was higher in the superheated steam treated workpiece than in the superheated steam non-treated workpiece. There was observed no significant difference between both samples in the elemental composition of the MoSiN films.

Figure 6:
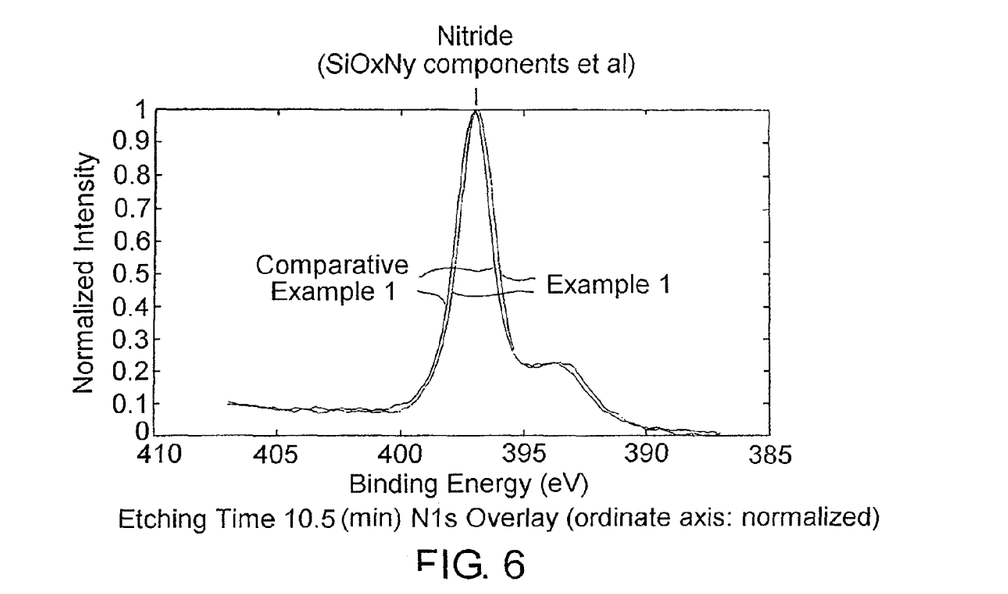
FIG. 6 is a diagram showing the results of the XPS analysis (narrow-scan overlay) in which, for a comparison between the chemical states with or without a superheated steam treatment, a comparison was made between MoSiN films (etching time: 10.5 [min]) with respect to the N1s peak position.
Figure 7:
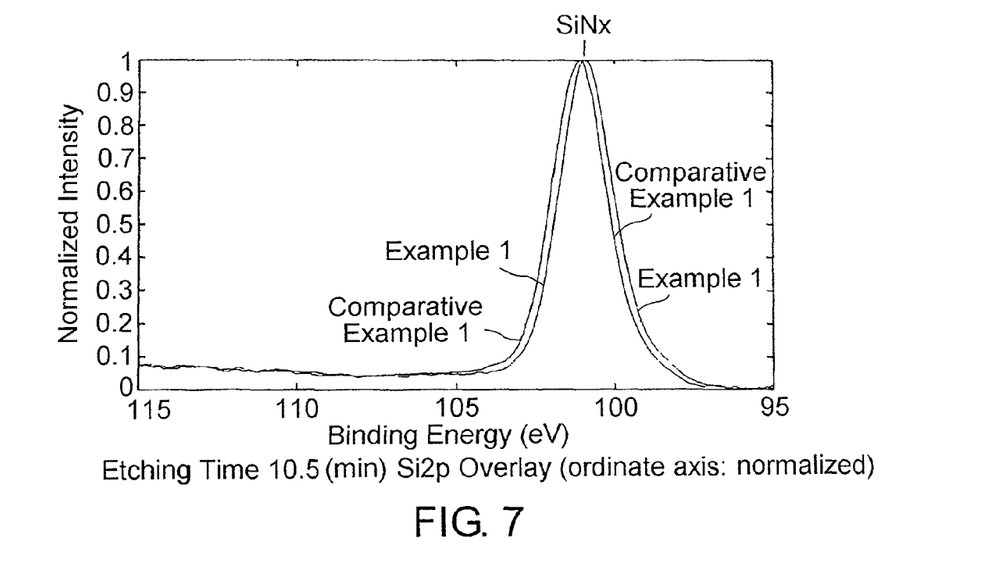
FIG. 7 is a diagram showing the results of the XPS analysis (narrow-scan overlay) in which, for a comparison between the chemical states with or without a superheated steam treatment, a comparison was made between MoSiN films (etching time: 10.5 [min]) with respect to the Si2p peak position.
Figure 8:
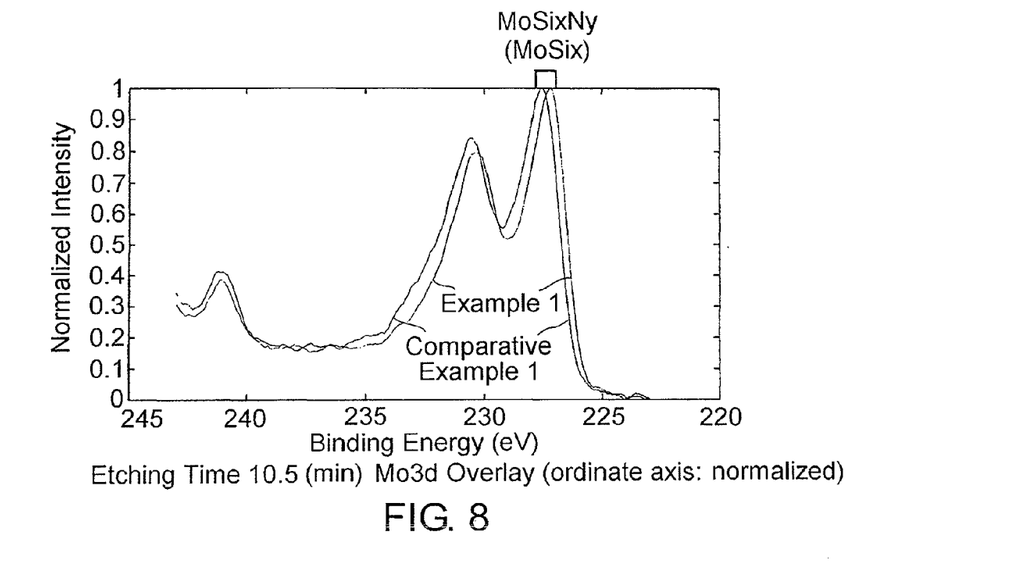
FIG. 8 is a diagram showing the results of the XPS analysis (narrow-scan overlay) in which, for a comparison between the chemical states with or without a superheated steam treatment, a comparison was made between MoSiN films (etching time: 10.5 [min]) with respect to the Mo3d peak position.

With respect to the chemical states of the MoSiN films, $MoSi_xN_y$ components are considered to be predominant from the N1s, Si2p, and Mo3d peak positions (see FIGS. 6, 7, and 8).

Further, according to FIGS. 7 and 8, a chemical shift occurred toward the lower energy side due to the superheated steam treatment and thus it is considered that the chemical states of Si and Mo are changed. It is considered that Si—N bonds and Mo—Si bonds are increased.

Specifically, in a comparison between the chemical states of the MoSiN films (etching time: 10.5 [min]) in both samples, the superheated steam non-treated workpiece is located on the higher binding energy side as compared with the superheated steam treated workpiece with respect to the Mo3d peak position and there was also observed a difference between the Mo3d peak shapes (see FIG. 8). Also with respect to the Si2p peak position, the superheated steam non-treated workpiece is located on the higher binding energy side as compared with the superheated steam treated workpiece (see FIG. 7). Assuming that damages due to Ar ion etching are the same between both samples, the possibility is considered that the chemical states of molybdenum and silicon differ from each other between both samples.

(2) Evaluation of Irradiation Durablity

The durability against ArF excimer laser light irradiation was examined for the superheated steam treated workpiece (sample of Example 1) and the superheated steam non-treated workpiece (sample of Comparative Example 1).

The conditions of the ArF excimer laser light irradiation were such that the oscillation frequency of an ArF excimer laser was set to 300 Hz, the energy density per pulse to 10 $mJ/cm^2$/pulse, and the cumulative exposure amount to 10 $kJ/cm^2$.

In the superheated steam treated workpiece (sample of Example 1), before and after the irradiation of ArF excimer laser light, almost no change in the film thickness was observed, the transmittance change amount (change in the transmittance normalized to a value before the laser light irradiation) was −5%, and the phase difference change amount (change in the phase difference normalized to a value before the laser light irradiation) was −0.25%.

In the superheated steam non-treated workpiece (sample of Comparative Example 1), before and after the irradiation of ArF excimer laser light, the film thickness change amount was 7 nm, the transmittance change amount was 44.9%, and the phase difference change amount was −5.3%.

(3) Evaluation of Cleaning Durability

The durability against hot water was examined for the superheated steam treated workpiece (sample of Example 1) and the superheated steam non-treated workpiece (sample of Comparative Example 1). In this event, in each sample, the surface oxide film was removed and the thin film itself was evaluated.

Specifically, the change in the film thickness was examined after treatment with deionized water (DI water) at 85° C. for 120 minutes.

In a comparison between the film thickness changes of the superheated steam treated workpiece (sample of Example 1) and the superheated steam non-treated workpiece (sample of Comparative Example 1) before and after the above-mentioned hot water treatment, the film thickness change amount of the superheated steam treated workpiece was about half that of the superheated steam non-treated workpiece and thus the durability against hot water was improved about twice.

EXAMPLE 2

In Example 2, the amount of Mo in a target for use in forming a MoSiN film (light-semitransmissive film) was increased about twice. (Thin Film Forming Process)

Specifically, using a mixed target of molybdenum (Mo) and silicon (Si) (Mo:Si=19 mol %:81 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:$N_2$:He=9:81:76) at a gas pressure of 0.3 Pa, thereby forming a MoSiN film made of molybdenum, silicon, and nitrogen and having a thickness of 94 nm.
(Heat Treatment after Film Formation)

Then, a heat treatment was applied to a transparent substrate formed with the MoSiN film. Specifically, the heat treatment was carried out in the atmosphere at a heating temperature of 280° C. for a heating time of 10 minutes.

This MoSiN film had a transmittance of 1.0% with a phase difference of 235.3 degrees for ArF excimer laser light.
(Superheated Steam Treatment)

Then, a superheated steam treatment was applied to the heat-treated MoSiN film. Using the apparatus shown in FIG. 9, the conditions of the superheated steam treatment were such that the temperature was set to 750° C. (temperature at an outlet of the nozzle for supplying superheated steam into the chamber) and the treatment time was set to 10 minutes.

COMPARATIVE EXAMPLE 2

"Thin Film Forming Process" was carried out under the same conditions as in Example 2 and, in "Heat Treatment after Film Formation", a heat treatment was carried out at 280° C. for 10 minutes in an electric furnace, which were the same conditions as in Example 2. "Superheated Steam Treatment" was not carried out in Comparative Example 2.
(Evaluation)
(1) Analysis of Thin Film The Raman spectroscopic analysis was carried out for the superheated steam treated workpiece (sample of Example 2) and the superheated steam non-treated workpiece (sample of Comparative Example 2).

The results of the Raman spectroscopic analysis are shown in FIG. 3.

As shown in FIG. 3, the same tendency as in Example 1 is observed in Example 2.

Further, as shown in FIG. 3, the following tendencies 1) and 2) are observed from a comparison with Example 1.

1) Around 250 cm$^{-1}$, the Raman peak intensity is increased about twice in Example 2 as compared with Example 1. Since the Mo amount in Example 2 is about twice that in Example 1, the possibility is considered that Raman lines around 250 cm$^{-1}$ result from the structure containing Mo.

Even in the case where the superheated steam treatment is not carried out, a Raman band resulting from the Mo amount is observed due to an approximately twofold increase in the Mo amount. However, the Raman peak intensity is relatively small (about 1/3 or less as compared with the case where the superheated steam treatment is carried out) and thus a large difference is observed as compared with Example 2.

2) Around 500 cm$^{-1}$, even if the Mo amount is increased twice, the Raman peak intensity hardly changes. In the case where the superheated steam treatment is not carried out, no Raman band is observed around 500 cm$^{-1}$ in either sample regardless of the Mo amount.

From the tendencies 1) and 2) (i.e. in consideration of the difference between the Raman spectra based on the difference between the Mo amounts), it is conjectured that the skeleton structure in which Mo is captured in the amorphous SiN structure is formed in the MoSiN film and that more Mo is captured in the sample with the double Mo amount. Further, the possibility is considered that, by carrying out the superheated steam treatment, the order of the SiN structure is enhanced (e.g. while being amorphous, distribution of bond angles and bond lengths is reduced) and many local structures containing Mo (e.g. amorphous molybdenum nitride and/or molybdenum silicide) are formed.

The present inventors have elucidated that, normally, when the Mo amount in a film is large, the irradiation durablity is degraded. In this invention, even if the Mo amount in the film is large, the irradiation durablity is excellent. The reason for this is considered to be that the structure of Mo is stable. Although the Mo amount in the film is large, the (Mo/Mo+Si) ratio is about 20% and thus the content of Mo is relatively small as compared with the other elements. Nevertheless, the Raman bands around 250 cm$^{-1}$ and around 500 cm$^{-1}$ are largely changed depending on whether the superheated steam treatment is carried out or not. Further, the Raman band around 250 cm$^{-1}$ is largely changed due to a small change in the Mo amount (about 10% change in the (Mo/Mo+Si) ratio) in the film. Therefore, it is considered that the Raman band around 250 cm$^{-1}$ is not a Raman band based on the Mo amount in the film, but is a Raman band based on a structural change of Mo. For example, it is considered that when the superheated steam treatment is not carried out, Mo in the MoSiN film is present in a free (unbound) state in the amorphous SiN skeleton structure [Si—N bond network], while, by carrying out the superheated steam treatment, the structure of Mo is more stabilized. The stabilization of the structure of Mo is considered to be caused by, for example, the formation of the skeleton structure in which Mo is captured in the amorphous SiN skeleton structure (e.g. the formation of Mo—Si bonds, Mo—Si—N bonds, etc.). It is considered that, as a result, the movement of Mo in the film is suppressed and thus the irradiation durablity is excellent even if the Mo amount in the film is large.

(2) Evaluation of Irradiation Durablity

The durability against ArF excimer laser light irradiation was examined for the superheated steam treated workpiece (sample of Example 2) and the superheated steam non-treated workpiece (sample of Comparative Example 2).

The conditions of the ArF excimer laser light irradiation were such that the oscillation frequency of an ArF excimer laser was set to 300 Hz, the energy density per pulse to 10 mJ/cm$^2$/pulse, and the cumulative exposure amount to 10 kJ/cm$^2$.

In the superheated steam treated workpiece (sample of Example 2), before and after the irradiation of ArF excimer laser light, the film thickness change amount was 2 nm, the transmittance change amount was 1.8%, and the phase difference change amount was −0.1%. Thus, the irradiation durablity was excellent.

In the superheated steam non-treated workpiece (sample of Comparative Example 2), before and after the irradiation of ArF excimer laser light, the film thickness change amount was 20 nm, the transmittance change amount was 140.4%, and the phase difference change amount was −8.1%. Thus, the irradiation durablity was poor.

(3) Evaluation of Cleaning Durability

The durability against hot water was examined for the superheated steam treated workpiece (sample of Example 2) and the superheated steam non-treated workpiece (sample of Comparative Example 2). In this event, in each sample, the surface oxide film was removed and the thin film itself was evaluated.

Specifically, the change in the film thickness was examined after treatment with deionized water (DI water) at 85° C. for 120 minutes.

In a comparison between the film thickness changes of the superheated steam treated workpiece (sample of Example 2) and the superheated steam non-treated workpiece (sample of Comparative Example 2) before and after the above-mentioned hot water treatment, the film thickness change amount of the superheated steam treated workpiece was about half that of the superheated steam non-treated workpiece and thus the durability against hot water was improved about twice.

EXAMPLE 3

In Example 3, a light-shielding film having a two-layer structure in which a MoSiN film (light-shielding layer) and a MoSiON film (front-surface antireflection layer) were laminated in this order was formed instead of the light-semitransmissive film of Example 1.

(Thin Film Forming Process)

Figure 2:
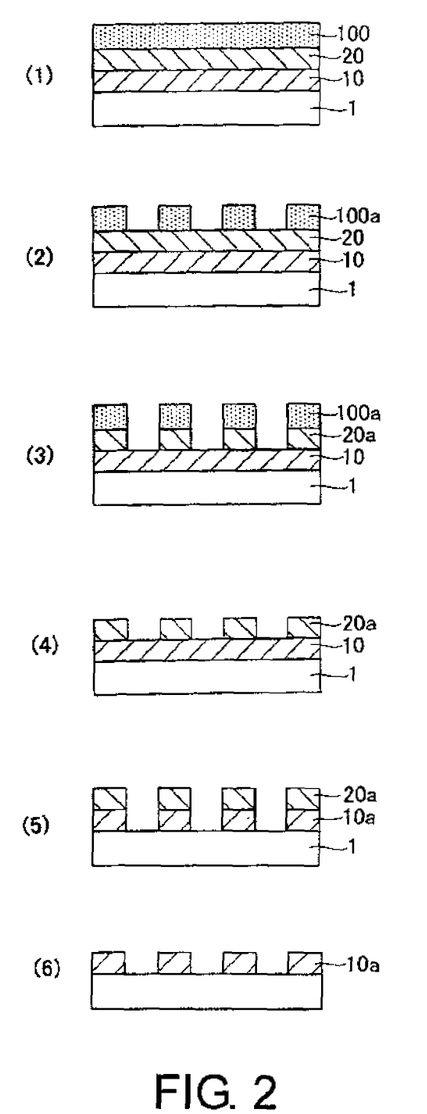
FIGS. 2, (1) to (6) are exemplary cross-sectional views showing the processes of manufacturing a binary mask.

As shown in FIG. 2, (1), using a synthetic quartz glass substrate having a 6-inch square size with a thickness of 0.25 inches as a transparent substrate 1, a MoSiN film (light-shielding layer) and a MoSiON film (front-surface antireflection layer) were formed in this order as a light-shielding film 10 on the transparent substrate 1.

Specifically, using a mixed target of molybdenum (Mo) and silicon (Si) (Mo:Si=21 at %:79 at %), reactive sputtering (DC sputtering) was carried out in a mixed gas atmosphere of argon (Ar) and nitrogen ($N_2$), thereby forming a light-shielding layer (MoSiN film, Mo:Si:N=14.7 at %:56.2 at %:29.1 at %) to a thickness of 50 nm on the transparent substrate 1.

Then, using a mixed target of molybdenum (Mo) and silicon (Si) (Mo:Si=4 at %:96 at %), reactive sputtering (DC sputtering) was carried out in a mixed gas atmosphere of argon (Ar), oxygen ($O_2$), nitrogen ($N_2$), and helium (He), thereby forming a front-surface antireflection layer (MoSiON film, Mo:Si:O:N=2.6 at %:57.1 at %:15.9 at %:24.4 at %) to a thickness of 10 nm on the light-shielding layer.

The elements of the respective layers (light-shielding film) were analyzed by the Rutherford backscattering spectrometry.

The total thickness of the light-shielding film 10 was set to 60 nm. The optical density (OD) of the light-shielding film 10 was 3.0 at a wavelength 193 nm of ArF excimer laser light.

(Heat Treatment after Film Formation)

Then, the above-mentioned substrate was heat-treated (annealed) at 450° C. for 30 minutes.

(Superheated Steam Treatment)

Then, a superheated steam treatment was applied to the heat-treated MoSi-based light-shielding film. Using the apparatus shown in FIG. 9, the conditions of the superheated steam treatment were such that the temperature was set to 750° C. (temperature at an outlet of the nozzle for supplying superheated steam into the chamber) and the treatment time was set to 10 minutes.

(Evaluation)

The durability against ArF excimer laser light irradiation was examined for the light-shielding film subjected to the above-mentioned superheated steam treatment.

The conditions of the ArF excimer laser light irradiation were such that the oscillation frequency of an ArF excimer laser was set to 300 Hz, the energy density per pulse to 10 $mJ/cm^2$/pulse, and the cumulative exposure amount to 10 $kJ/cm^2$.

Before and after the irradiation of ArF excimer laser light, almost no change in the film thickness was observed. Thus, the irradiation durablity was excellent.

EXAMPLE 4

In Example 4, a superheated steam treatment was carried out after forming a thin film pattern.

(Thin Film Forming Process and Heat Treatment after Film Formation)

In Example 4, "Thin Film Forming Process" and "Heat Treatment after Film Formation" were carried out under the same conditions as in Example 1. In Example 4, "Superheated Steam Treatment" after "Heat Treatment after Film Formation" as in Example 1 was not carried out.

(Formation of Thin Film Pattern)

As shown in FIG. 1, (1), on a light-semitransmissive film (MoSiN film) 2 formed on a substrate 1, which were obtained above, a chemically amplified positive resist for electron beam writing (PRL009: manufactured by FUJIFILM Electronic Materials Co., Ltd.) was coated to form a resist film 3. The resist film 3 was formed by spin coating using a spinner (spin coating apparatus).

Then, using an electron beam writing apparatus, a required pattern was written on the resist film 3 and, thereafter, the resist film 3 was developed with a predetermined developer, thereby forming a resist pattern 3a (see FIGS. 1, (2) and (3)).

Then, using the resist pattern 3a as a mask, the light-semitransmissive film 2 was dry-etched, thereby forming a light-semitransmissive film pattern 2a (see FIG. 1, (4)). A mixed gas of $SF_6$ and He was used as a dry etching gas.

Then, the remaining resist pattern was stripped, thereby obtaining the substrate having the light-semitransmissive film pattern (MoSiN film pattern) (see FIG. 1, (5)).

There was almost no change in the composition, transmittance, and phase difference of the light-semitransmissive film as compared with those at the time of the manufacture of a mask blank.

(Superheated Steam Treatment)

Then, a superheated steam treatment was applied to the light-semitransmissive film pattern on the substrate thus obtained. Using the apparatus shown in FIG. 9, the conditions of the superheated steam treatment were such that the temperature was set to 750° C. (temperature at an outlet of the nozzle for supplying superheated steam into the chamber) and the treatment time was set to 10 minutes.

(Evaluation)

(1) Evaluation of Irradiation Durablity

The durability against ArF excimer laser light irradiation was examined for the light-semitransmissive film pattern subjected to the above-mentioned superheated steam treatment.

The conditions of the ArF excimer laser light irradiation were such that the oscillation frequency of an ArF excimer laser was set to 300 Hz, the energy density per pulse to 10 $mJ/cm^2$/pulse, and the cumulative exposure amount to 10 $kJ/cm^2$.

Before and after the irradiation of ArF excimer laser light, almost no change in the film thickness was observed, the transmittance change amount was −5%, and the phase difference change amount was −0.25%.

(2) Evaluation of Cleaning Durability

The durability against hot water was examined for the light-semitransmissive film pattern subjected to the above-mentioned superheated steam treatment.

Specifically, the change in the film thickness was examined after treatment with deionized water (DI water) at 85° C. for 120 minutes. As a result, almost no change in the film thickness was observed and thus the durability against hot water was excellent.

EXAMPLE 5

In Example 5, a superheated steam treatment was carried out after forming a thin film pattern.

(Thin Film Forming Process and Heat Treatment after Film Formation)

In Example 5, "Thin Film Forming Process" and "Heat Treatment after Film Formation" were carried out under the same conditions as in Example 3. In Example 5, "Superheated Steam Treatment" after "Heat Treatment after Film Formation" as in Example 3 was not carried out.

(Manufacture of Transfer Mask)

As shown in FIG. 2, (1), an etching mask film 20 made of a chromium-based thin film was formed on a light-shielding film 10.

Specifically, using a DC magnetron sputtering apparatus and using a chromium target, the film formation was carried out in a mixed gas atmosphere of argon (Ar), carbon dioxide ($CO_2$), nitrogen ($N_2$), and helium (He), thereby forming an etching mask film (CrOCN film, Cr:O:C:N=33.0 at %:38.9 at %:11.1 at %:17.0 at %) to a thickness of 15 nm.

The elements of the CrOCN film (etching mask film) were analyzed by the Rutherford backscattering spectrometry.

Then, on the etching mask film 20, a chemically amplified positive resist for electron beam writing (exposure) (PRL009: manufactured by FUJIFILM Electronic Materials Co., Ltd.) was coated by a spin-coating method to form a resist film 100 with a thickness of 100 nm (FIG. 2, (1)).

Then, using an electron beam writing apparatus, a required pattern was written on the resist film 100 and, thereafter, the resist film 100 was developed with a predetermined developer, thereby forming a resist pattern 100a (FIG. 2, (2)).

Then, using the resist pattern 100a as a mask, the etching mask film 20 was dry-etched, thereby forming an etching mask film pattern 20a (FIG. 2, (3)). A mixed gas of $Cl_2$ and $O_2$ ($Cl_2:O_2$=4:1) was used as a dry etching gas.

Then, the remaining resist pattern 100a was removed (FIG. 2, (4)).

Then, using the etching mask film pattern 20a as a mask, the light-shielding film 10 was dry-etched using a mixed gas of $SF_6$ and He, thereby forming a light-shielding film pattern 10a (FIG. 2, (5)).

Then, the etching mask film pattern 20a was removed by dry etching with a mixed gas of $Cl_2$ and $O_2$ ($Cl_2:O_2=4:1$), thereby obtaining the substrate having the light-shielding film pattern 10a (FIG. 2, (6)).

(Superheated Steam Treatment)

Then, a superheated steam treatment was applied to the light-shielding film pattern on the substrate thus obtained. Using the apparatus shown in FIG. 9, the conditions of the superheated steam treatment were such that the temperature was set to 750° C. (temperature at an outlet of the nozzle for supplying superheated steam into the chamber) and the treatment time was set to 10 minutes.

(Evaluation)

(1) Evaluation of Irradiation Durablity

The durability against ArF excimer laser light irradiation was examined for the light-shielding film pattern subjected to the above-mentioned superheated steam treatment.

The conditions of the ArF excimer laser light irradiation were such that the oscillation frequency of an ArF excimer laser was set to 300 Hz, the energy density per pulse to 10 $mJ/cm^2$/pulse, and the cumulative exposure amount to 10 $kJ/cm^2$.

Before and after the irradiation of ArF excimer laser light, almost no change in the film thickness was observed and thus the irradiation durablity was excellent.

(2) Evaluation of Cleaning Durability

The durability against hot water was examined for the light-shielding film pattern subjected to the above-mentioned superheated steam treatment. Specifically, the change in the film thickness was examined after treatment with deionized water (DI water) at 85° C. for 120 minutes. As a result, almost no change in the film thickness was observed and thus the durability against hot water was excellent.

EXAMPLE 6

A Cr-based light-shielding film was formed on a light-semitransmissive film formed in the same manner as in Example 1 and subjected to a superheated steam treatment. Then, the Cr-based light-shielding film and the light-semitransmissive film were respectively patterned, thereby manufacturing a halftone phase shift mask (transfer mask) having a light-shielding band. This halftone phase shift mask and the binary mask (transfer mask) obtained in Example 5 were irradiated with ArF excimer laser light (wavelength: 193 nm) under the same conditions as in Example 1. Using each of the transfer masks of the two kinds thus obtained, a transfer pattern was exposed and transferred onto a resist film on a semiconductor wafer as a transfer target. An exposure apparatus was of the immersion type with annular illumination using an ArF excimer laser as a light source. Specifically, by setting each transfer mask on a mask stage of the exposure apparatus, a transfer pattern was exposed and transferred onto a resist film for ArF immersion exposure formed on a semiconductor wafer. Then, the exposed resist films were developed, thereby forming resist patterns, respectively.

Further, using the resist patterns, a circuit pattern including a DRAM half-pitch (hp) 32 nm line & space (L&S) pattern (formed using the halftone phase shift mask) and a circuit pattern including a DRAM half-pitch (hp) 45 nm line & space (L&S) pattern (formed using the binary mask) were formed on the semiconductor wafers, respectively.

The obtained circuit patterns on the semiconductor wafers were observed by a transmission electron microscope (TEM). As a result, the specifications of the DRAM half-pitch (hp) 32 nm/45 nm L&S patterns were fully satisfied. That is, it was confirmed that the halftone phase shift mask and the binary mask described above were fully able to transfer circuit patterns including DRAM half-pitch (hp) 32 nm/45 nm L&S patterns onto semiconductor wafers, respectively.

What is claimed is:

1. A method of manufacturing a mask blank having a thin film on a transparent substrate, comprising the steps of:
   forming the thin film made of a material containing a transition metal on the transparent substrate; and
   applying a superheated steam treatment to the thin film,
   wherein a temperature of the superheated steam treatment is 500° C. or more.

2. The method according to claim 1, wherein the material further contains silicon.

3. The method according to claim 2, wherein the thin film is a light-semitransmissive film and the material further contains one or more elements selected from oxygen and nitrogen.

4. The method according to claim 1, wherein the thin film is a light-shielding film.

5. A method of manufacturing a transfer mask having, on a transparent substrate, a pattern of a thin film made of a material containing a transition metal, comprising the steps of:
   forming the pattern of the thin film by patterning the thin film formed on the transparent substrate; and
   applying a superheated steam treatment to the pattern of the thin film,
   wherein a temperature of the superheated steam treatment is 500° C. or more.

6. The method according to claim 5, wherein the material further contains silicon.

7. The method according to claim 6, wherein the thin film is a light-semitransmissive film and the material further contains one or more elements selected from oxygen and nitrogen.

8. The method according to claim 5, wherein the thin film is a light-shielding film.

9. A mask blank having a thin film on a transparent substrate,
   wherein the thin film is made of a material containing a transition metal and is modified by applying a superheated steam treatment thereto, and
   wherein a temperature of the superheated steam treatment is 500° C. or more.

10. The mask blank according to claim 9, wherein the material further contains silicon.

11. The mask blank according to claim 10, wherein the thin film is a light-semitransmissive film and the material further contains one or more elements selected from oxygen and nitrogen.

12. The mask blank according to claim 9, wherein the thin film is a light-shielding film.

13. A transfer mask manufactured by using the mask blank according to claim 9 and patterning the thin film.

14. A transfer mask having a pattern of a thin film on a transparent substrate, wherein the pattern of the thin film is a film that is made of a material containing a transition metal and is modified by applying a superheated steam treatment thereto, and
   wherein a temperature of the superheated steam treatment is 500° C. or more.

15. The transfer mask according to claim 14, wherein the material further contains silicon.

16. The transfer mask according to claim 15, wherein the thin film is a light-semitransmissive film and the material further contains one or more elements selected from oxygen and nitrogen.

17. The transfer mask according to claim 14, wherein the thin film is a light-shielding film.

18. A mask blank having a thin film on a transparent substrate, wherein the thin film is made of a material composed mainly of molybdenum, silicon, and nitrogen, and the thin film has peaks around 250 cm$^{-1}$ and around 500 cm$^{-1}$ when normalized around 1000 cm$^{-1}$ in Raman spectroscopic analysis of the thin film.

19. A method of manufacturing a semiconductor device, comprising forming a circuit pattern on a semiconductor wafer using a transfer mask which is manufactured using the mask blank according to claim 9.

20. A method of manufacturing a semiconductor device, comprising forming a circuit pattern on a semiconductor wafer using a transfer mask which is manufactured using the mask blank according to claim 18.

21. A method of manufacturing a semiconductor device, comprising forming a circuit pattern on a semiconductor wafer using the transfer mask according to claim 14.

* * * * *